United States Patent [19]

Chen et al.

[11] Patent Number: 5,973,387
[45] Date of Patent: Oct. 26, 1999

[54] TAPERED ISOLATED METAL PROFILE TO REDUCE DIELECTRIC LAYER CRACKING

[75] Inventors: Robert C. Chen, Los Altos; Jeffrey A. Shields, Sunnyvale; Khanh Tran, San Jose, all of Calif.

[73] Assignee: Advanced Micro Devices, Inc., Sunnyvale, Calif.

[21] Appl. No.: 08/993,053

[22] Filed: Dec. 18, 1997

[51] Int. Cl.[6] ...................... H01L 21/3205; H01L 27/108
[52] U.S. Cl. .......................... 257/669; 257/670; 257/674; 257/620; 257/775
[58] Field of Search .................................. 257/669, 670, 257/674, 620, 775

[56] References Cited

FOREIGN PATENT DOCUMENTS

| 402036534 | 2/1990 | Japan | 257/775 |
| 403022536 | 1/1991 | Japan | 257/775 |
| 405082747 | 4/1993 | Japan | 257/620 |

OTHER PUBLICATIONS

IBM (Method for metallization patterning, IBM Technical Disclosure Bulletin, IBM Corp. p. 451, vol. 37 No. 05), May 1994.

*Primary Examiner*—Wael M. Fahmy
*Assistant Examiner*—Hung Van Duong

[57] ABSTRACT

Leading and trailing metal features in a dense array of conductive lines bordering an open field are formed with side surfaces that gradually taper in the direction of the open field toward an underlying substrate. Each side surface bordering the open field is formed with a sufficient slope to reduce cracking of the subsequently deposited dielectric gap fill layer at high stress areas bordering the open field.

27 Claims, 2 Drawing Sheets

TAPERED ISOLATED METAL PROFILE TO REDUCE DIELECTRIC LAYER CRACKING

TECHNICAL FIELD

The present invention relates to a method of manufacturing a high density, multi-metal layer semiconductor device having high integrity. The invention has particular applicability in manufacturing semiconductor devices with design features of 0.25 microns and under.

BACKGROUND ART

The escalating requirements for high density and performance associated with ultra large scale integration demand design features of 0.25 microns and under, e.g., about 0.18 microns, increased transistor and circuit speeds, and high reliability. These requirements challenge the limitations of semiconductor technology.

Conventional methodology for forming patterned metal layers comprises a subtractive etching or etchback step as the primary metal patterning technique. Such a method involves the formation of a first dielectric layer on a semiconductor substrate, typically doped moncrystalline silicon, with conductive contacts formed therein for electrical connection with an active region on the semiconductor substrate, such as a source/drain region. A metal layer is deposited on the first dielectric layer. The metal layer is typically a composite comprising a first metal layer such as tungsten or titanium, a second intermediate primary layer such as aluminum or an aluminum alloy, and an upper anti-reflective coating, which also serves as an etchstop layer, such as titanium nitride. A photoresist mask is formed on the metal layer having a pattern defining a plurality of conductive features in accordance with design requirements. The metal layer is etched, using the photoresist mask, to form a conductive pattern comprising metal features separated by gaps, such as a plurality of metal lines with interwiring spacings therebetween. A dielectric layer, such as spin-on glass (SOG), is then applied to the resulting conductive pattern to fill the gaps. Another dielectric layer is deposited, such as silicon oxide derived from tetraethyl orthosilicate (TEOS) or silane by plasma enhanced chemical vapor deposition (PECVD). Planarization is then effected, as by etching or chemical mechanical polishing (CMP).

The conductive pattern typically comprises a dense array of metal features, typically separated by gaps less than about 1 micron, e.g., about 0.375 microns for metal features of about 0.50 microns. Such a dense array is schematically illustrated in FIG. 1, and comprises leading metal feature 11A and trailing metal feature 11B formed on first dielectric layer 10. A layer of gap filling material 12, such as SOG, is deposited to fill in the gaps. A preferred gap filling material is hydrogen silsesquioxane (HSQ).

However, it was found that when a dense array is bordered by an open field, i.e., a distance extending beyond about 1 micron, such as beyond about 1.5 microns, e.g., greater than 2 microns, cracking occurs in the dielectric gap fill layer 12 proximate leading 11A and trailing 11B metal features bordering the open field, as indicated by reference numeral 13. Such cracking typically occurs where the gap filling layer is deposited at a relatively high thickness and at a relatively severe angle, as where a leading or trailing metal feature borders an open field. Such cracks adversely impact circuit speeds and device reliability.

Accordingly, there exists a need for semiconductor methodology for gap filling patterned metal layers without experiencing cracking in high stress areas, such as adjacent leading and trailing edges of a dense array bordering an open field.

DISCLOSURE OF THE INVENTION

An object of the present invention is a semiconductor device exhibiting reduced cracking in dielectric gap filled layers.

Another object of the present invention is a method of manufacturing a semiconductor device having gap filled dielectric layers with reduced cracking.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises forming a dense array of metal features including leading and trailing metal features, each having a side surface bordering an open field, each side surface gradually tapering in the direction of the open field toward an underlying substrate; and forming a layer of a dielectric material on the dense array of metal features, wherein each side surface has a sufficient slope to prevent cracking of the dielectric material proximate the side surface.

A further aspect of the present invention is a semiconductor device comprising a dense array of spaced apart metal features including leading and trailing metal features each having a side surface bordering an open field which gradually tapers in the direction of the open field toward an underlying substrate; and a layer of a dielectric material deposited on the dense array of metal features, wherein each side surface has a sufficient slope to prevent cracking of the deposited dielectric material proximate the side surface.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
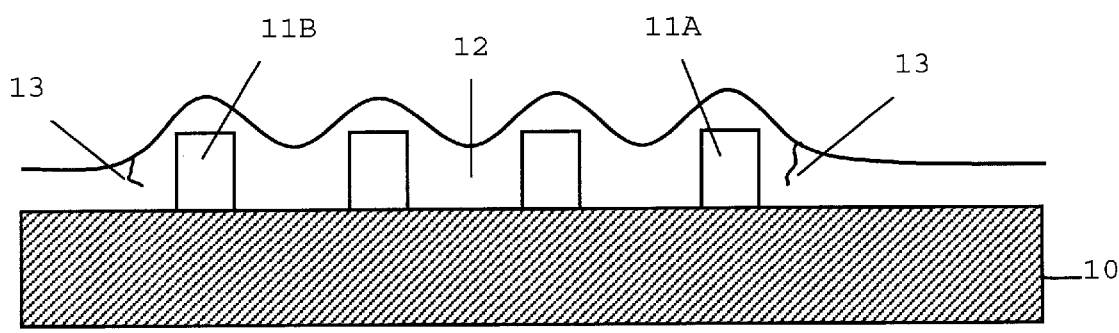
FIG. 1 schematically illustrates cracking in a dielectric gap filled layer.

The present invention addresses and solves problems stemming from the formation of cracks in dielectric layers deposited to fill in the gaps of a patterned conductive, e.g., metal layer, particularly at high stress areas. The problem of crack formation in gap fill dielectric layers is particularly acute at high stress areas, such as the areas between leading and trailing metal features bordering an open field, as illustrated in FIG. 1. Such dielectric gap fill cracks trap contamination and minute particles, thereby creating defects, cause delamination and adversely impact device reliability.

In accordance with the present invention, dielectric gap fill cracking is significantly reduced and/or avoided by strategically tapering the side surfaces of the leading and trailing metal features of a dense array bordering an open field, at high stress areas at a sufficient slope to reduce the stress and, hence, cracking. As a result of tapering the side surface of a leading or trailing metal feature in the direction of the open field, the thickness of the deposited dielectric gap fill material, such as HSQ, at the high stress area, is decreased, thereby reducing crack formation.

The side surfaces of the leading and trailing metal features bordering the open field can be suitably tapered in accordance with embodiments of the present invention during etching by adjusting etching parameters to increase polymer formation. Such increased polymer formation can be achieved by varying the amount of an appropriate reactant or power input during plasma etching, and/or other polymer affecting process effective variable. For example, in employing a fluorocarbon, such as $CHF_3$, in a nitrogen carrier, the amount of nitrogen carrier can be increased and/or the amount of fluorocarbon, such as $CHF_3$, increased, and/or the amount of chlorine gas can be decreased, to increase polymer formation. In accordance with the present invention, various parameters during plasma etching are controlled in order to increase polymer formation thereby purposely increasing the slope of each side surfaces of the leading and trailing metal features bordering an open field with respect to an upper surface of the underlying first dielectric layer. In this way, crack formation in the subsequently deposited HSQ gap fill layer is significantly reduced or substantially eliminated.

Figure 2:
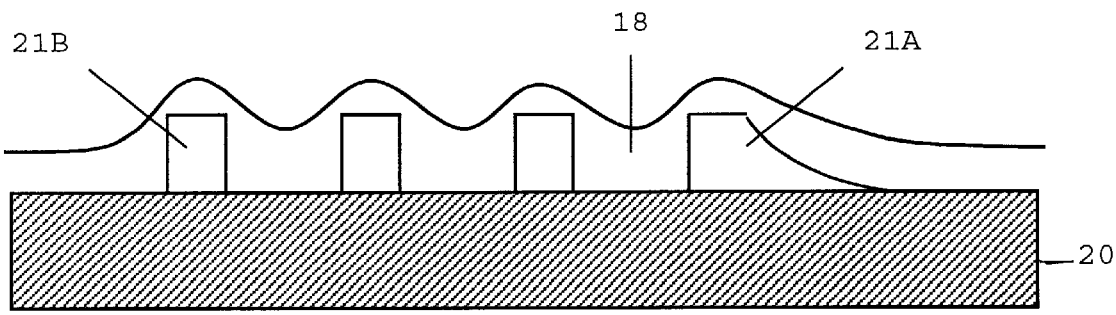
FIG. 2 schematically illustrates an embodiment of the present invention.

An embodiment of the present invention is schematically illustrated in FIG. 2, wherein a dense array of metal features is formed on first dielectric layer 20, such as silicon dioxide. The dense array comprises leading metal feature 21A and trailing metal feature 21B. In accordance with the present invention, the metal layer is etched to form a dense array of conductive lines under conditions which favor polymer formation. The amount of polymer formation is controlled by controlling one or more etching variables which affect polymer formation to control the slope of each surface of the leading and trailing metal features bordering the open field, which open field extends a distance greater than the gaps between the metal features of the dense array. Typically, the distance between the metal features of the dense array is less than about 1 micron, e.g., less than about 0.5 microns; whereas, the open field extends a distance greater than about 1 micron, such as greater than about 1.5 microns, e.g., greater than about 2 microns.

As a result of the microloading effect, etching within the dense array of conductive lines proceeds at a slower rate than etching in the open field bordering the leading and trailing edges. By controlling the etching process to favor polymer formation and by continually etching until the dense array is fully formed, in that the metal between adjacent metal features in the dense array is completely removed to form spaced apart, i.e., gapped, metal features, the side surfaces of the leading and trailing edges adjacent the open field is controlled to achieve a desired slope.

In carrying out the embodiments of the present invention, the conductive layer can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds.

Embodiments of the present invention include forming leading and trailing metal features having a bottom surface with a width of about 10% to about 60% greater than the width of the top surface, such as about 20% to about 45% greater than the width of the top surface. Embodiments of the present invention also include forming a dense array comprising leading and trailing metal features having side surfaces bordering an open field, which side surfaces have a slope of about 35° to about 55° with respect to the upper surface of the underlying dielectric layer, such as about 45°. It was found that such sloping side surfaces are sufficient to prevent cracking of the dielectric material proximate to the side surface.

In embodiments of the present invention, a metal layer is etched, typically employing reactive ion etching (RIE) under conditions controlled to increase polymer formation to achieve a desired side surface taper. For example, the amount of gaseous reactant, inert gas and/or pressure and total gas flow are variables which affect the amount of polymer formation during etching, i.e., the amount of $Cl_2$, $CHF_3$, $CF_4$, nitrogen gas, temperature can be varied to increase polymer formation and, hence, the slope of the side surfaces of the leading and trailing metal features bordering the open field.

After etching to form the patterned metal layer, a dielectric layer 18 is deposited to fill in the gaps between the metal features. The dielectric layer may comprise any dielectric materials employed in the production of semiconductor devices, however, hydrogen silsesquioxane (HSQ) has been found particularly suitable. HSQ is relatively carbon free, thereby avoiding poison via problems. Moreover, due to the virtual absence of carbon, it is not necessary to etch back HSQ below the upper surface of the metal lines to avoid shorting. In addition, HSQ exhibits excellent planarity and is capable of gap filling small interwiring spacings employing conventional spin-on equipment. One form of HSQ is commercially available from Dow Corning Corp. under the product name Flowable Oxide® or $FO_x$®. Thereafter, an oxide layer may be formed on the dielectric material and planarized by etching or chemical-mechanical polishing.

The present invention enables the provision of a highly reliable conductive interconnect structure, employing a dielectric material, such as HSQ, to fill gaps in patterned metal layers comprising unique metal features without experiencing cracking at high stress areas of the gap fill layer. The present invention is cost effective and can easily be integrated into conventional processing and equipment.

The previous descriptions, numerous specific details are set forth, such as specific materials, structures, chemicals, processes, etc., to provide a thorough understanding of the present invention. However, the present invention can be practiced without resorting to the details specifically set forth. In other instances, well known processing structures have not been described in detail to not unnecessarily obscure the present invention.

Only the preferred embodiments of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

(a) forming a dense array of metal features, on a dielectric layer, including leading and trailing metal features each having a side surface bordering an open field, each side surface selectively gradually tapering in the direction of the open field toward an underlying substrate while the metal features between the leading and trailing metal features have side surfaces which extend substantially perpendicular to the substrate; and (b) forming a layer of a dielectric material on the dense array of metal features filling the gaps, wherein each tapering side surface has a sufficient slope to substantially prevent cracking of the dielectric material proximate the side surfaces, wherein the metal features are spaced apart by a distance less than about one micron while the open field extends beyond about one micron.

2. The method according to claim 1, wherein the dielectric material comprises hydrogen silsesquioxane (HSQ).

3. The method according to claim 2, wherein each metal feature has a bottom surface and a top surface, which method comprises forming the dense array such that the width of the bottom surface of the leading and trailing metal features is about 10% to about 60% greater than the width of the top surface.

4. The method according to claim 3, comprising forming the dense array such that the width of the bottom surface of the leading and trailing metal features is about 20% to about 45% greater than the width of the top surface.

5. The method according to claim 2, wherein each side surface has a slope of about 35° to about 55° with respect to an upper surface of the substrate.

6. The method according to claim 5, wherein each side surface has a slope of about 45°.

7. The method according to claim 1, further comprising:

forming an oxide layer on the dielectric material; and planarizing the oxide layer.

8. The method according to claim 1, wherein the metal features are spaced apart by a distance less than about 0.5 microns.

9. The method according to claim 1, wherein the open field extends a distance greater than about 1.5 microns.

10. The method according to claim 1, comprising:

forming a first dielectric layer;

forming a metal layer on the first dielectric layer;

forming a mask on the metal layer, which mask comprises a pattern defining a dense array of spaced apart metal features, including leading and trailing metal features each having a side surface bordering an open field;

etching the metal layer to form a pattern of metal features including the dense array, and controlling the etching to control the slope of the side surfaces; and forming a second layer of a dielectric material on the metal pattern and on the first dielectric layer filling the spaces between the metal features.

11. The method according to claim 10, wherein the second dielectric layer comprises hydrogen silsesquioxane (HSQ).

12. The method according to claim 11, wherein each metal feature has a bottom surface and a top surface, which method comprises etching the metal layer such that the bottom surface of the leading and trailing metal features has a width of about 10% to about 60% greater than the width of top surface.

13. The method according to claim 12, comprising etching the metal layer such that the bottom surface of the leading and the trailing metal features has a width of about 20% to about 45% greater than the width of the top surface.

14. The method according to claim 11, wherein each side surface has a slope of about 35° to about 55° with respect to an upper surface of the first dielectric layer.

15. The method according to claim 14, wherein each side surface has a slope of about 45°.

16. The method according to claim 10, further comprising:

depositing a third dielectric layer on the second dielectric layer; and planarizing the third dielectric layer by etching or chemical-mechanical polishing.

17. The method according to claim 16, wherein the third dielectric layer comprises an oxide.

18. The method according to claim 10, further comprising reactive ion etching in a plasma to form the metal features; and controlling the slope of the tapered side surface by controlling the amount of polymer formed during etching.

19. The method according to claim 18, comprising varying an amount of gaseous reactant, inert gas and/or pressure, to control the amount of polymer formed during etching.

20. The method according to claim 19, comprising varying the amount of nitrogen, fluorocarbon and/or chlorine to increase polymer formation during etching.

21. The method according to claim 20, comprising increasing the amount of nitrogen and/or fluorocarbon or decreasing the amount of chlorine to increase polymer formation during etching.

22. A semiconductor device comprising:

(a) dense array of spaced apart metal features, on a dielectric layer, including leading and trailing metal features each having a side surface bordering an open field which selectively gradually tapers in the direction of the open field toward an underlying substrate while the metal features between the leading and trailing metal features have side surfaces which extend substantially perpendicular to the substrate; and (b) a layer of a dielectric material deposited on the dense array of metal features filling the gaps, wherein each tapering side surface has a sufficient slope to prevent cracking of the deposited dielectric material proximate the side surface, wherein, the metal features are spaced apart by a distance less than about one micron while the open field extends beyond about one micron.

23. The semiconductor device according to claim 22, wherein the dielectric material comprises hydrogen silsesquioxane (HSQ).

24. The semiconductor device according to claim 23, wherein each metal feature has a bottom and a top surface, and the bottom surface of the leading and trailing metal features has a width about 10% to about 60% greater than the width of the top surface.

25. The semiconductor device according to claim 24, wherein the bottom surface of the leading and trailing metal features has a width about 20% to about 45% greater than the width of the top surface.

26. The semiconductor device according to claim 25, wherein each side surface has a slope of about 35° to about 55° with respect to an upper surface of the substrate.

27. The semiconductor device according to claim 26, wherein each side surface has a slope of about 45°.

* * * * *

UNITED STATES PATENT AND TRADEMARK OFFICE
CERTIFICATE OF CORRECTION

PATENT NO. : 5,973,387
DATED : Oct. 26, 1999
INVENTOR(S) : Chen et al.

It is certified that error appears in the above-identified patent and that said Letters Patent is hereby corrected as shown below:

In the Claims, in the Claim 22, line 2, before the word "dense" insert --a--.

Signed and Sealed this

Twenty-fourth Day of April, 2001

Attest:

NICHOLAS P. GODICI

Attesting Officer　　　　Acting Director of the United States Patent and Trademark Office